US011930588B2

(12) United States Patent
Hatano

(10) Patent No.: US 11,930,588 B2
(45) Date of Patent: Mar. 12, 2024

(54) SIGNAL TRANSMISSION APPARATUS AND SIGNAL TRANSMISSION METHOD

(71) Applicant: SONY GROUP CORPORATION, Tokyo (JP)

(72) Inventor: Sota Hatano, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 275 days.

(21) Appl. No.: 17/435,642

(22) PCT Filed: Jan. 30, 2020

(86) PCT No.: PCT/JP2020/003363
§ 371 (c)(1),
(2) Date: Sep. 1, 2021

(87) PCT Pub. No.: WO2020/202753
PCT Pub. Date: Oct. 8, 2020

(65) Prior Publication Data
US 2022/0151059 A1    May 12, 2022

(30) Foreign Application Priority Data

Mar. 29, 2019    (JP) ................................ 2019-066718

(51) Int. Cl.
*H05K 1/02*    (2006.01)
*H01R 12/70*    (2011.01)
(Continued)

(52) U.S. Cl.
CPC ....... *H05K 1/0245* (2013.01); *H01R 12/7076* (2013.01); *H01R 12/79* (2013.01);
(Continued)

(58) Field of Classification Search
CPC .... H05K 1/0245; H05K 1/0277; H05K 1/115; H05K 1/14; H05K 2201/10189; H01R 12/7076; H01R 12/79; H04N 25/70
See application file for complete search history.

(56) References Cited

U.S. PATENT DOCUMENTS 7,239,526 B1 *    7/2007   Bibee .................. H05K 1/0219
                                                        361/795
2011/0256739 A1    10/2011  Nakaie et al.
(Continued)

FOREIGN PATENT DOCUMENTS

CN    102292881 A    12/2011
CN    103037617 A    4/2013
(Continued)

OTHER PUBLICATIONS

International Search Report and Written Opinion of PCT Application No. PCT/JP2020/003363, dated Apr. 21, 2020, 08 pages of ISRWO.

*Primary Examiner* — Hoa C Nguyen
(74) *Attorney, Agent, or Firm* — CHIP LAW GROUP

(57) ABSTRACT

There are provided a signal transmission apparatus and a signal transmission method for use therewith, the apparatus using a small-sized connector configuration and a flexible printed circuit board to prevent a decrease in the quality of a differential signal. The flexible printed circuit board has signal transmission paths for transmitting the differential signal. At least one of connector connection parts of the flexible printed circuit board has a first connection part column and a second connection part column obtained by arranging a plurality of signal line connection parts, the signal line connection parts being connection parts between the signal transmission paths and intra-connector wiring. Each of the signal line connection parts in the connection part columns is configured to be connected with the signal (Continued)

transmission path formed on the back side of the flexible printed circuit board by way of a VIA (through-hole) formed between the first connection part column and the second connection part column. For example, the first connection part column includes a GND signal line connection part and a positive signal line connection part, and the second connection part column includes a GND signal line connection part and a negative signal line connection part.

11 Claims, 13 Drawing Sheets

(51) Int. Cl.
H01R 12/79 (2011.01)
H05K 1/11 (2006.01)
H05K 1/14 (2006.01)
H04N 25/70 (2023.01)

(52) U.S. Cl.
CPC ........... *H05K 1/0277* (2013.01); *H05K 1/115* (2013.01); *H05K 1/14* (2013.01); *H04N 25/70* (2023.01); *H05K 2201/10189* (2013.01)

(56) References Cited

U.S. PATENT DOCUMENTS

| 2013/0083505 | A1 | 4/2013 | Kobayashi | |
| 2014/0017953 | A1* | 1/2014 | Iwano | H01R 12/777 439/660 |
| 2014/0312987 | A1* | 10/2014 | Morita | H01P 5/107 333/137 |
| 2015/0016222 | A1* | 1/2015 | Kandori | B06B 1/0292 367/87 |
| 2015/0357760 | A1 | 12/2015 | Aihara et al. | |
| 2016/0204532 | A1* | 7/2016 | Ishida | H05K 1/117 174/251 |
| 2016/0204534 | A1* | 7/2016 | Ishida | H05K 1/118 439/61 |
| 2016/0270224 | A1* | 9/2016 | Ito | H05K 1/117 |
| 2018/0235087 | A1* | 8/2018 | Uchida | H05K 3/3463 |

FOREIGN PATENT DOCUMENTS

| CN | 105281063 A | 1/2016 |
| EP | 2538499 A1 | 12/2012 |
| JP | 2007-213998 A | 8/2007 |
| JP | 2013-080628 A | 5/2013 |
| JP | 2016-006874 A | 1/2016 |
| JP | 2018-043040 A | 3/2018 |
| WO | 2011/101922 A1 | 8/2011 |

* cited by examiner

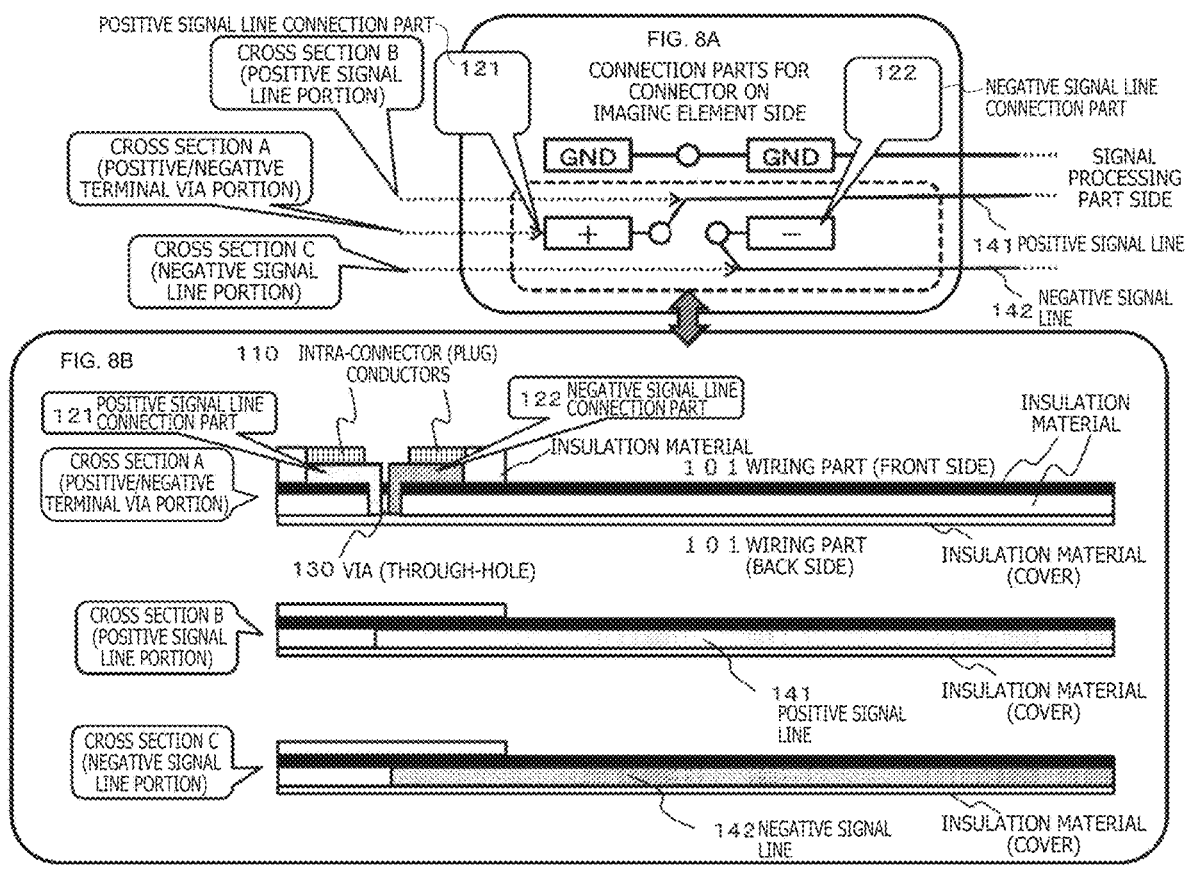

SIGNAL TRANSMISSION APPARATUS AND SIGNAL TRANSMISSION METHOD

CROSS REFERENCE TO RELATED APPLICATIONS

This application is a U.S. National Phase of International Patent Application No. PCT/JP2020/003363 filed on Jan. 30, 2020, which claims priority benefit of Japanese Patent Application No. JP 2019-066718 filed in the Japan Patent Office on Mar. 29, 2019. Each of the above-referenced applications is hereby incorporated herein by reference in its entirety.

TECHNICAL FIELD

The present disclosure relates to a signal transmission apparatus and a signal transmission method. More particularly, this disclosure relates to a signal transmission apparatus and a signal transmission method for use therewith, the signal transmission apparatus being small in size and capable of high-speed differential signal transmission while maintaining signal quality.

BACKGROUND ART

For example, each of the pixels of an imaging element for a camera accumulates an electrical charge reflecting the intensity of light from image capture. An electrical signal representing the electrical charge of each pixel is output to a signal processing part via transmission paths. The signal processing part performs diverse signal processing on the basis of the input signal, thereby generating recording images and display images.

From now on, there will be more high-quality imaging cameras for capturing 4K or 8K images of which the use is expected to increase. The number of pixels of an imaging element for such cameras is several to dozens of times as many as that of the existing imaging elements for capturing 2K images, for example. That means the amount of data to be output from the imaging element to the signal processing part will dramatically increase.

Some of the imaging elements introduced in recent years are configured to generate a digital signal by quantizing an analog signal reflecting the amount of electrical charge accumulated in each of the pixels of the imaging element, the digital signal being output to the signal processing part via digital signal transmission paths. The transmission of the digital signal makes use of differential signals, for example.

The use of differential signals makes it possible to transmit high-quality digital signals with reduced noise effects.

The digital signal output from the imaging element is transferred to the signal processing part via connectors and a flexible printed circuit board (FPC), for example. In such a configuration, however, the connectors are required to have connection parts spaced at a predetermined pitch apart from one another in order to connect with numerous signal lines. The connectors thus need to have an appropriate size. This is one factor impeding the implementation of small-sized lightweight cameras.

A related technology for reducing the size the connector configuration is described in PTL 1 (Japanese Patent Laid-open No. 2018-43040), for example. The literature discloses connectors reduced in size by using a three-dimensional substrate arrangement configuration.

However, the configuration described in this document is that of an endoscopic device and is different from those applicable to ordinary cameras.

Further, if terminal parts are densely formed simply to reduce the connector size, it can make an uneven configuration of the transmission paths for the signal lines involved. This can lead to a problem of variations in the impedance characteristics of the signal lines and a decrease in the quality of transmission signals.

CITATION LIST

Patent Literature

[PTL 1]
Japanese Patent Laid-open No. 2018-43040

SUMMARY

Technical Problem

The present disclosure has been made in view of the above problem, for example. An object of the disclosure is to provide a signal transmission apparatus and a signal transmission method for use therewith, the signal transmission apparatus being reduced in size by use of connectors and a flexible printed circuit board (FPC) and configured to permit high-speed differential signal transmission while maintaining signal quality.

Solution to Problem

According to a first aspect of the present disclosure, there is provided a signal transmission apparatus including a flexible printed circuit board having signal transmission paths for transmitting a differential signal. At least one of connector connection parts of the flexible printed circuit board has a first connection part column and a second connection part column obtained by arranging a plurality of signal line connection parts, the signal line connection parts being connection parts between the signal transmission paths and intra-connector wiring as two column lines in parallel with each other. Each of the signal line connection parts formed in the first connection part column and in the second connection part column is configured to be connected with the signal transmission path formed on a back side of the flexible printed circuit board by way of a VIA (through-hole) formed between the first connection part column and the second connection part column.

According to a second aspect of the present disclosure, there is provided a signal transmission method for performing a process of transmitting a differential signal by use of a flexible printed circuit board. At least one of connector connection parts of the flexible printed circuit board has a first connection part column and a second connection part column obtained by arranging a plurality of signal line connection parts, the signal line connection parts being connection parts between the signal transmission paths and intra-connector wiring as two column lines in parallel with each other. The signal transmission method includes transmitting an output from the intra-connector wiring to the signal line connection parts configured in the first connection part column and in the second connection part column, and transmitting the differential signal over the signal transmission path formed on a back side of the flexible printed circuit board and by way of a VIA (through-hole) formed between the first connection part column and the second connection part column.

Other objects, features and advantages of the present disclosure will become apparent upon a reading of the ensuing more detailed description of some preferred embodiments of this disclosure with reference to the appended drawings. In this description, the term "system" refers to an aggregate of logically configured apparatuses. The apparatuses in such a configuration may or may not be housed in a single enclosure.

Thus, the configuration of one embodiment of the present disclosure provides a signal transmission apparatus and a signal transmission method for use therewith, the apparatus using a small-sized connector configuration and a flexible printed circuit board to prevent a decrease in the quality of a differential signal.

Specifically, for example, the flexible printed circuit board has signal transmission paths for transmitting the differential signal. At least one of connector connection parts of the flexible printed circuit board has a first connection part column and a second connection part column, each of the columns including a plurality of signal line connection parts for connection between the signal transmission paths and intra-connector wiring. Each of the signal line connection parts in the connection part columns is configured to be connected with the signal transmission path formed on the back side of the flexible printed circuit board by way of a VIA (through-hole) formed between the first and the second connection part columns. For example, the first connection part column includes a GND signal line connection part and a positive signal line connection part, and the second connection part column includes a GND signal line connection part and a negative signal line connection part.

The above configuration thus provides a signal transmission apparatus and a signal transmission method for use therewith, the apparatus using a small-sized connector configuration and a flexible printed circuit board to prevent a decrease in the quality of a differential signal.

It is to be noted that the advantageous effects stated in this description are only examples and not limitative of the present disclosure that may also provide other advantages.

BRIEF DESCRIPTION OF DRAWINGS

FIGS. 8A and 8B depict explanatory diagrams explaining examples of a cross-sectional configuration of the flexible printed circuit board (FPC) according to the present disclosure.

DESCRIPTION OF EMBODIMENTS

Figure 1:
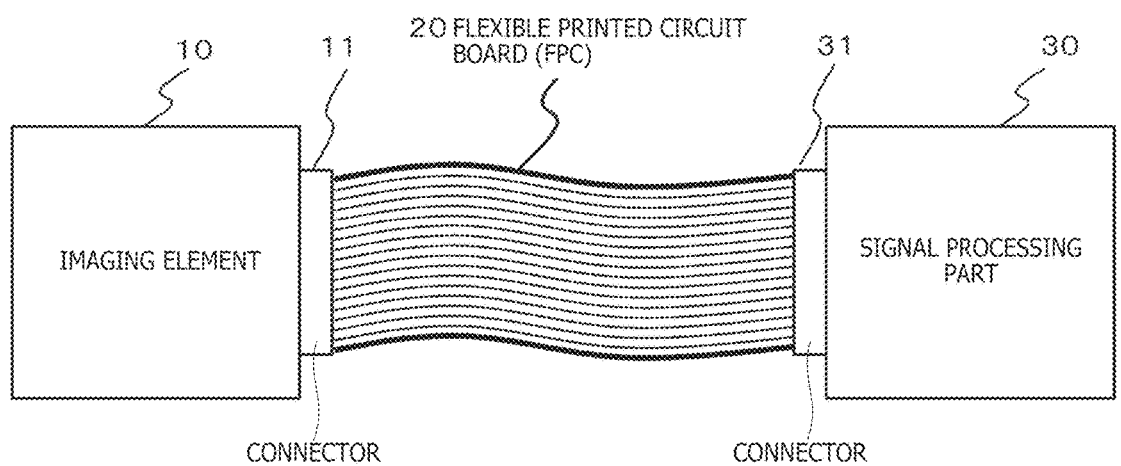
FIG. 1 is an explanatory diagram explaining examples of an imaging element, a signal processing part, and a flexible printed circuit board on which are formed signal transmission paths that transfer digital signals generated on the side of the imaging element to the signal processing part.

A signal transmission apparatus and a signal transmission method according to the present disclosure are described below in detail with reference to the accompanying drawings. The description will be given under the following headings.

1. Configuration example of the signal transmission paths between the imaging element and the signal processing part
2. Configuration example of the differential signal transmission paths
3. Configurations of the signal transmission apparatus according to the present disclosure
4. Other embodiments
5. Conclusion regarding the configurations according to the present disclosure 1. Configuration Example of the Signal Transmission Paths Between the Imaging Element and the Signal Processing Part Described first is a configuration example of the signal transmission paths between the imaging element and the signal processing part.

Each of the pixels constituting the imaging element of a camera accumulates an electrical charge corresponding to the amount of received light. Electrical signals reflecting the electrical charges thus accumulated in the pixels are output to a signal processing part via the transmission paths. The signal processing part performs image generation and other processes based on the signals output from the imaging element.

More imaging elements in recent years are configured to convert, on the imaging element side, analog signals reflecting the amounts of accumulated electrical charges of the pixels into digital signals for output to the signal processing part.

FIG. 1 depicts an imaging element 10, a signal processing part 30, and a flexible printed circuit board (FPC: Flexible Printed Circuits) 20 on which signal paths for transferring the digital signals generated on the imaging element side to the signal processing part 30 are formed.

The imaging element 10 and the flexible printed circuit board (FPC) 20 are connected by a connector 11. The signal processing part 30 and the flexible printed circuit board (FPC) 20 are connected by a connector 31 as well.

The flexible printed circuit board (FPC) 20 is used as the signal transmission paths in order to provide a predetermined movable range for the imaging element 10. The movable range is, for example, intended to reduce a decrease in the quality of captured images caused by camera shake at the time of imaging. This configuration is designed to prevent the minute motion of camera shake from being propagated directly to the imaging element.

The movable range for the imaging element 10 is described below with reference to FIGS. 2A and 2B.

Figure 2:
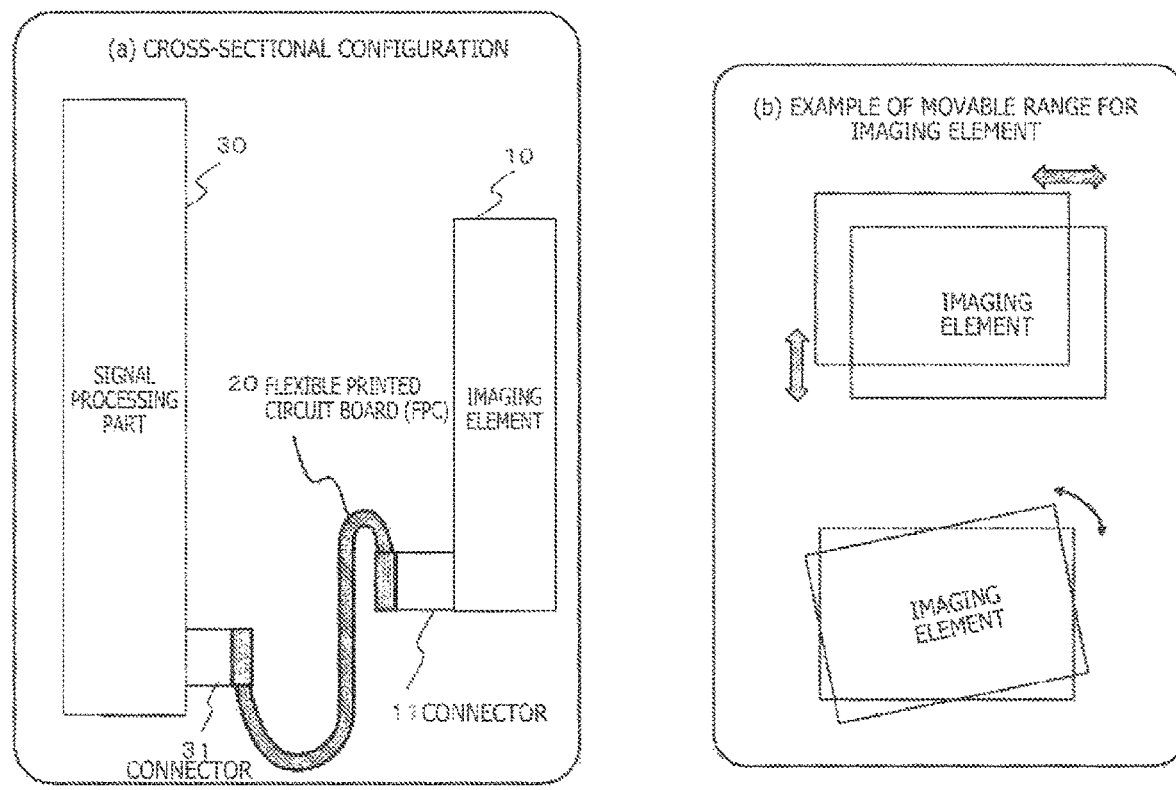
FIGS. 2A and 2B depict explanatory diagrams explaining a movable range of an imaging element.

FIG. 2A depicts a cross-sectional configuration of a camera. What is illustrated here is a cross section of the imaging element 10, the signal processing part 30, and the flexible printed circuit board (FPC) 20 for connecting these two components. The signal processing part 30 is in a state of being fixed to the camera body.

Meanwhile, the imaging element 10 is provided with a movable range such that the camera shake caused by hand movement at the time of imaging will not be propagated directly to the imaging element.

That is, as depicted in FIG. 2B, the imaging element 10 is attached to the camera in a manner allowed to move in vertical, horizontal, and rotating directions within a predetermined range.

The flexible printed circuit board (FPC) 20 is utilized as the circuit for transmitting output signals from the imaging element 10 so as not to impede the movement of the imaging element 10.

Preferably, the connector 11 attached to the imaging element 10 may be small-sized and lightweight so as not to hamper the movement of the imaging element 10.

For example, the signals output from the imaging element 10 to the signal processing part 20 are differential signals including digital signals generated by A/D conversion on the imaging element side.

The differential signals allow, when used over two signal lines, two currents (+, −) in opposite phase to each other to flow in parallel so that the difference in potential therebetween is transmitted as a digital signal value. Whereas some noise is generated between the signal transmission paths, an approximately similar noise is added to the transmission paths of two currents (+, −) in opposite phase to each other. The potential difference between the two signal lines cancels out the noise, thereby permitting transmission of digital signals with reduced noise effects.

2. Configuration Example of the Differential Signal Transmission Paths

Before the ensuing description of the signal transmission apparatus according to the present disclosure, a signal transmission configuration example that uses an existing flexible printed circuit board (FPC) for differential signal transmission is described below.

Figure 3:
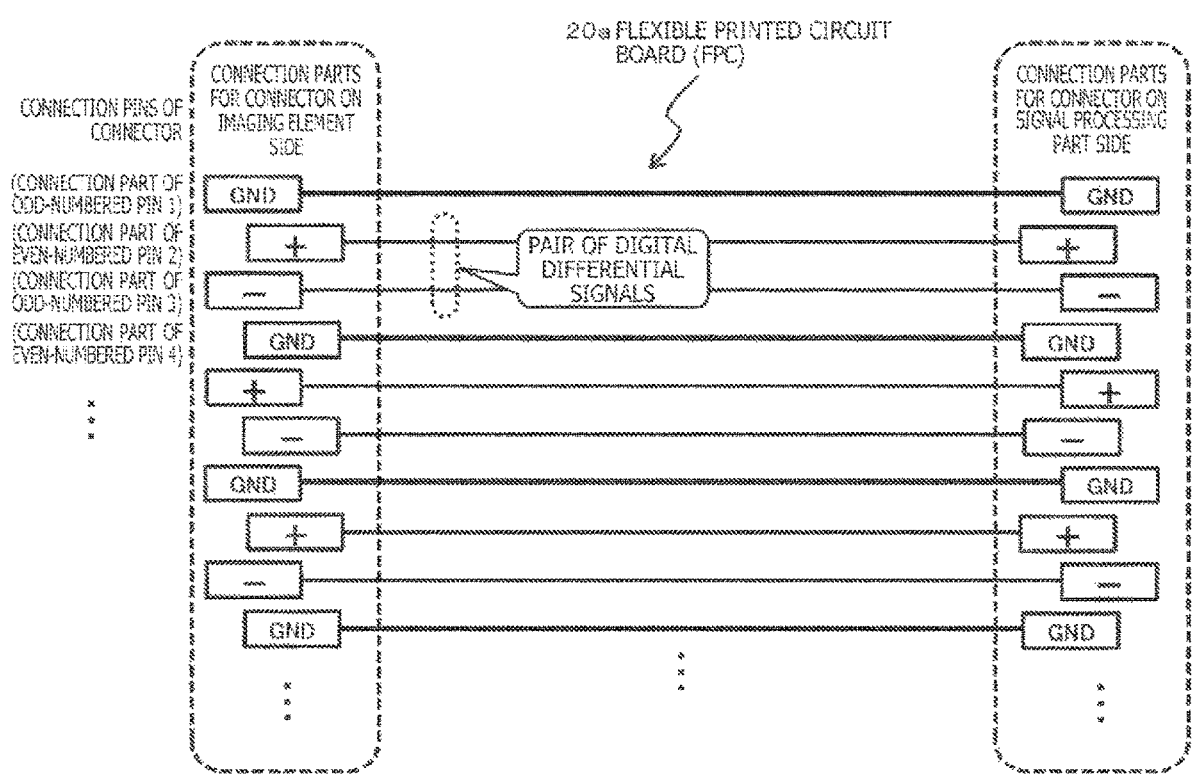
FIG. 3 is a view depicting an existing configuration example for transmitting differential signals using a flexible printed circuit board (FPC).

FIG. 3 is a view depicting an existing configuration example for transmitting differential signals using a flexible printed circuit board (FPC).

A flexible printed circuit board 20a depicted in FIG. 3 is configured to have multiple pairs of differential signal lines for transmitting two currents (+, −) in opposite phase to each other, each pair of differential signal lines being provided with one GND signal line.

The flexible printed circuit board 20a is wired with 8 pairs, 16 pairs, or other multiple pairs of differential signal lines, for example. Digital differential signals corresponding to multiple pixels of the imaging element 10 are transmitted to the signal processing part 30 via one pair of differential signal lines.

As described above with reference to FIG. 1, the imaging element 10 and the flexible printed circuit board 20a are connected by the connector 11, and the signal processing part 30 and the flexible printed circuit board 20a are connected by the connector 31 as well.

As described above with reference to FIGS. 2A and 2B, the connector 11 attached to the imaging element 10 is required to be small-sized and lightweight so as not to impede the movement of the imaging element 10.

In a configuration for reducing the connector size, the positions of the connection parts of the signal lines formed on the connector are staggered between adjacent signal lines.

As depicted on the left side of FIG. 3, the "connection parts for the connector on the imaging element side" make up a repeating configuration of three signal lines including a GND signal line, a positive signal line, and a negative signal line from the top down. These signal lines are configured to be connected successively with the connection parts (pins) formed on the connector.

The GND signal line in the top position is connected to an odd-numbered pin 1 of the connector, the positive signal line in the next position is connected to an even-numbered pin 2 of the connector, and the negative signal line in the next position is connected to an odd-numbered pin 3 of the connector. In like manner, the signal lines are connected alternately to the odd-numbered and even-numbered pins.

The odd-numbered and even-numbered pins making up the signal line connection parts formed on the connector are staggered crosswise as depicted in the drawing.

The connector is reduced in size and weight when the positions of the connection parts (pins) formed on the connector for the signal lines are staggered between adjacent signal lines.

However, one problem with the above configuration is that impedance characteristics become uneven for the GND signal, positive signal, and negative signal, i.e., the signals output from the imaging element 10 to the flexible printed circuit board 20a via the connector 11, the uneven impedance characteristics incurring a decrease in the quality of transmitted differential signals.

In particular, the paired differential signal lines constituting the positive and negative signal lines for transmitting one differential signal have their contact point positions staggered significantly on the connector. The considerable stagger may incur deviations of the output position and output timing relative to the flexible printed circuit board 20a and probably result in a decrease in the quality of transmitted differential signals.

In a case where the amount of data transmitted per unit time is small, the decrease in the quality of transmitted differential signal is negligible and not problematic even with the configuration depicted in FIG. 3. These days, however, cameras are required to transmit high-quality images such as 4K or 8K images at high frequency. The amount of data transmitted per unit time is thus increasing. Specifically, the cameras are required to transmit "high-speed differential signals" having frequency characteristics of 5 GHz or higher, for example.

In a case where such high-speed differential signals are to be transmitted, one problem with the configuration depicted in FIG. 3 is that it cannot ensure signal quality required for the transmission, and necessary quantities of data transmission cannot be secured.

A configuration effective for solving the above problem is one in which there is no deviation between the contact point positions, on the connector, of the positive and negative signal lines making up the pairs of differential signal lines. One such configuration is depicted in FIG. 4.

Figure 4:
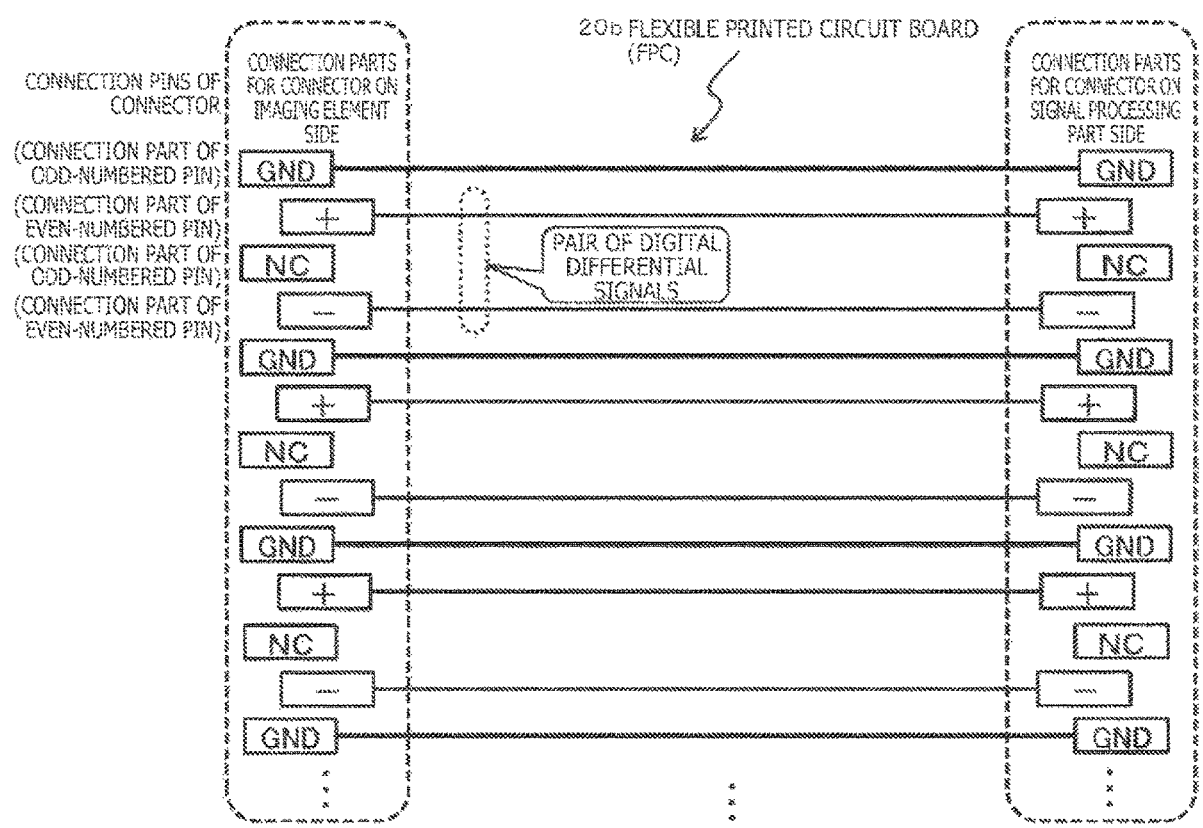
FIG. 4 is an explanatory diagram explaining a configuration example for eliminating a deviation between contact point positions of a positive signal line and a negative signal line making up a pair of differential signal lines on a connector.

The flexible printed circuit board 20b depicted in FIG. 4, as with the one in FIG. 3, is configured to have multiple pairs of differential signal lines for transmitting two currents (+, −) in opposite phase to each other, each pair of differential signal lines being provided with one GND signal line.

In the configuration depicted in FIG. 4, as detailed on the left side thereof, the "connection parts for the connector on the imaging element side" make up a repeating pattern of three signal lines including a GND signal line, a positive signal line, an NC part, and a negative signal line from the top down.

The "NC" signifies a connection part (pin) of the connector not connected with any signal line of the flexible printed circuit board 20b. That is, the NC stands for a Non-Connected pin.

In the configuration depicted in FIG. 4, there is no deviation between contact point positions, on the connector, of the positive and negative signal lines making up each pair of differential signal lines for transmitting one differential signal. There occur no deviations of the output position and output timing relative to the flexible printed circuit board 20b. This provides even impedance characteristics and thereby suppresses a decrease in the quality of transmitted differential signals.

In the configuration depicted in FIG. 4, however, there are multiple NC pins arranged on the connector as the connection parts (pins) not used for signal transmission. One problem with this configuration is an increase in the area occupied by the connector, which defeats the small-size and lightweight requirements.

Figure 5:
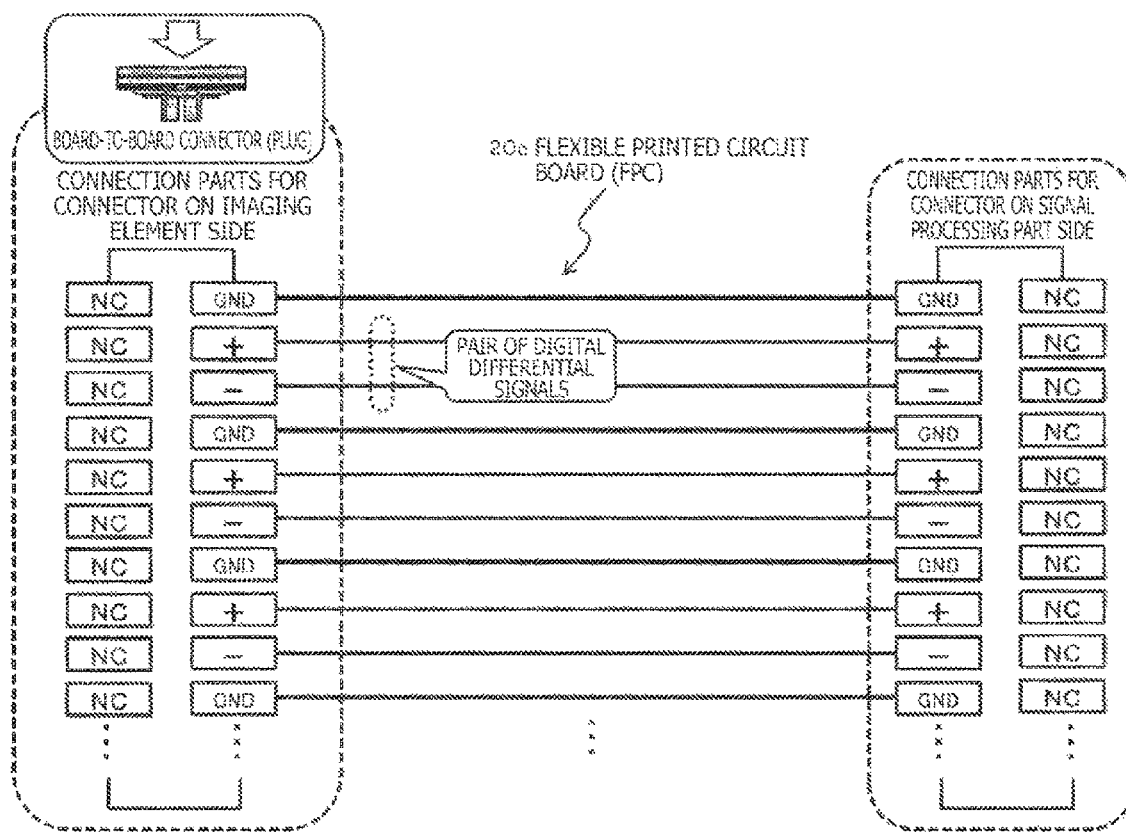
FIG. 5 is an explanatory diagram explaining a configuration example that uses a "board-to-board connector."

As another configuration effective for solving the above-described problem with the configuration in FIG. 3, FIG. 5 depicts a configuration for eliminating the decrease in the quality of transmitted signals caused by the deviation between the contact point positions of a positive signal line and a negative signal line making up each pair of differential signal lines on the connector.

The flexible printed circuit board 20c depicted in FIG. 5, as with the one in FIG. 3, is configured to have multiple pairs of differential signal lines for transmitting two currents (+, −) in opposite phase to each other, each pair of differential signal lines being provided with one GND signal line.

In the configuration depicted in FIG. 5, as detailed on the left side thereof, the "connection parts for the connector on the imaging element side" have two column lines of connection parts (pins) in parallel with each other.

The connector is what is known as a "board-to-board connector." The two column lines of the connection parts (pins) on the connector may each be connected with a different circuit board.

In a case where the "board-to-board connector" is used, a plug of the board-to-board connector is attached to the side of the flexible printed circuit board, and a receptor of the board-to-board connector is attached to the side of the imaging element, for example. Engaging the plug with the receptor provides connector connection, which connects the wiring of the flexible printed circuit board with the wiring of the imaging element.

The connection is implemented by means of conductors (gold-plated nickel, etc.) formed inside the connector and other conductors (copper, etc.).

For example, the "connection parts for the connector on the imaging element side" depicted on the left side of FIG. 5 correspond to what is viewed from above the board-to-board connector (plug), as depicted in the upper part of the drawing.

That is, the "connection parts for the connector on the imaging element side" depicted on the left side of FIG. 5 represent the individual connection parts connected with the conductors arranged in the long-side direction inside the connector as observed from above the board-to-board connector (plug).

The flexible printed circuit board 20c depicted in FIG. 5, as with the one in FIG. 3, is configured to have multiple pairs of differential signal lines for transmitting two currents (+, −) in opposite phase to each other, each pair of differential signal lines being provided with one GND signal line.

In the configuration depicted in FIG. 5, as detailed on the left side thereof, the "connection parts for the connector on the imaging element side" have two column lines of connection parts (pins) in parallel with each other.

In the example depicted in FIG. 5, only the connection parts (pins) in one of the two column lines (right-side column line) of the "connection parts for the connector on the imaging element side" are used as a repeating configuration of a GND signal line, a positive signal line, and a negative signal line from the top down. The connection parts in the other column line (left-side column line) are configured to make up "NC" parts, i.e., they are not connected with the signal lines of the flexible printed circuit board 20c.

Also in the configuration depicted in FIG. 5, there is no deviation between the contact point positions, on the connector, of the positive and negative signal lines making up each pair of differential signal lines for transmitting one differential signal. There occur no deviations of the output position and output timing relative to the flexible printed circuit board 20b. This provides even impedance characteristics and thereby maintains the quality of transmitted differential signals.

In the configuration depicted in FIG. 5, however, as with the above-described configuration in FIG. 4, there are multiple NC pins arranged on the connector as the connection parts (pins) not used for signal transmission. One problem with this configuration is an increase in the area occupied by the connector, which defeats the small-size and lightweight requirements.

3. Configurations of the Signal Transmission Apparatus According to the Present Disclosure Configurations of the signal transmission apparatus according to the present disclosure are described below.

Figure 6:
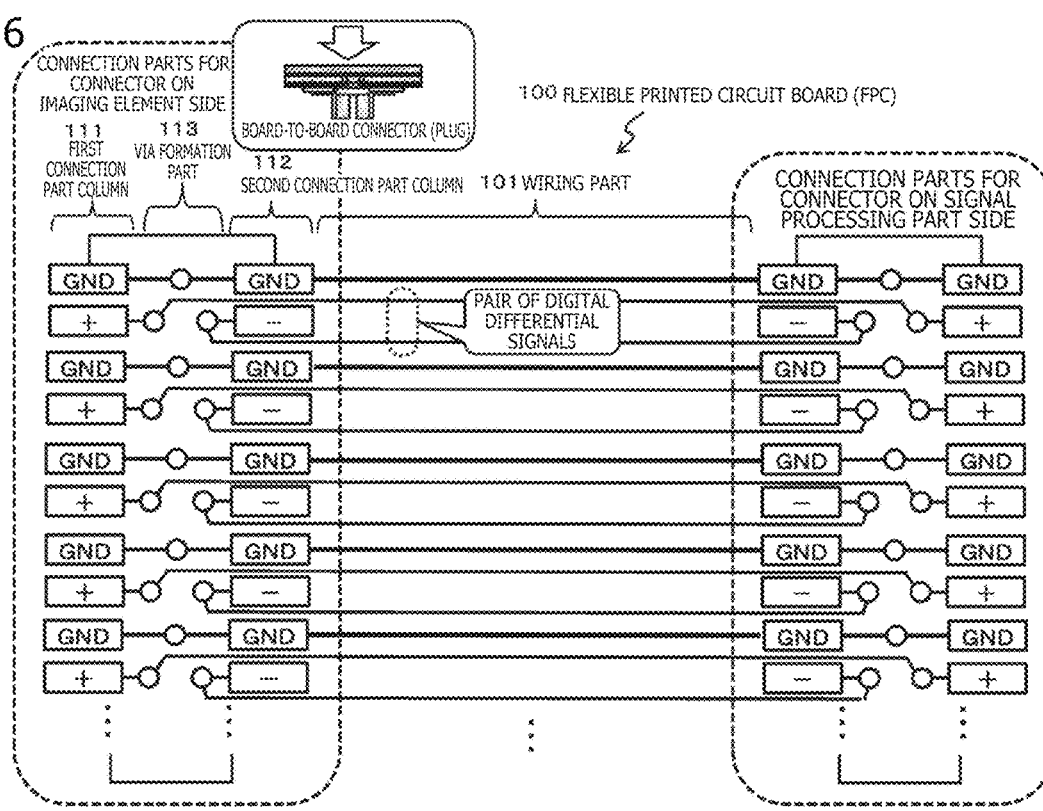
FIG. 6 is an explanatory diagram explaining a configuration example (first embodiment) of a flexible printed circuit board (FPC) according to the present disclosure.

FIG. 6 is an explanatory diagram explaining a wiring configuration of a flexible printed circuit board (FPC) 100 and a configuration of connector connection parts making up a signal transmission apparatus according to the present disclosure (first embodiment).

The flexible printed circuit board of the present disclosure to be described hereunder is also used as the signal transmission paths between the imaging element 10 and the signal processing part 30, as explained above with reference to FIGS. 1, 2A, and 2B. The imaging element 10 and the signal processing part 30 are configured to be connected with the flexible printed circuit board by the connectors 11 and 31.

As with the flexible printed circuit board (FPC) 20a described above with reference to FIG. 3, the wiring configuration of the flexible printed circuit board (FPC) 100 of the present disclosure depicted in FIG. 6 involves using multiple pairs of differential signal lines for transmitting two currents (+, −) in opposite phase to each other, each pair of differential signal lines being provided with one GND signal line.

The flexible printed circuit board 100 is wired with 8 pairs, 16 pairs, or other multiple pairs of differential signal lines, for example. Digital differential signals corresponding to the pixel values of multiple pixels of the imaging element are transmitted to the signal processing part 30 via one pair of differential signal lines. The digital differential signals corresponding to all pixels configured in the imaging element are transmitted successively to the signal processing part 30 via multiple pairs of differential signal lines configured on the flexible printed circuit board 100.

As depicted on the left side of FIG. 6, on the flexible printed circuit board 100 of the present disclosure, the "connection parts for the connector on the imaging element side" are configured to make up two parallel column lines of connection parts (pins) as described above with reference to FIG. 5. That is, there is provided a connection part configuration corresponding to the "board-to-board connector configuration."

The "connection parts for the connector on the imaging element side" depicted on the left side of FIG. 6 correspond to what is viewed from above a board-to-board connector (plug) 18a, as illustrated in the upper part of the drawing.

That is, the "connection parts for the connector on the imaging element side" depicted on the left side of FIG. 6 represent the individual connection parts connected with the conductors arranged in the long-side direction inside the connector, as observed from above the board-to-board connector (plug) 18a.

The connection parts for the connector on the imaging element side on the flexible printed circuit board 100 of this disclosure depicted in FIG. 6 are configured as a first connection part column 111 and a second connection part column 112 constituting two lines in parallel with each other as illustrated. Further configured between the two connection part lines, i.e., between the first connection part column 111 and the second connection part column 112, is what is called a VIA (through-hole) formation part 113 constituted by through-holes.

The first connection part column 111 is configured to have a GND signal line connection part and a positive signal line connection part formed alternately from the top down. The second connection part column 112, i.e., the other connection part line, is configured to have a GND signal line connection part and a negative signal line connection part formed alternately from the top down.

Rectangular regions indicated by symbols "GND," "+," and "−" in the first connection part column 111 and in the second connection part column 112 are the connection parts (contact points) for connection with output signal lines on the imaging element side. These connection parts are provided on the front side of the flexible printed circuit board 100.

The connection parts on the front side of the flexible printed circuit board 100 correspond to the connection parts between the signal transmission paths constituting the wiring of the flexible printed circuit board 100 on one hand and intra-connector wiring (i.e., wiring connected to the imaging element side) on the other hand.

The connection parts (GND, positive connection part, and negative connection part) on the front side of the flexible printed circuit board 100 receive output signals from the imaging element side, before transmitting the received signals to the signal processing part side through the VIAs in the VIA (through-hole) formation part 113 and by way of signal lines formed on the back side of the flexible printed circuit board 100.

That is, the signal lines of a wiring part 101 depicted in FIG. 6 constitute the wiring part configured on the back side of the flexible printed circuit board 100.

Preferably, the connector connection parts on the side of the signal processing part 30 may be configured similar to the connector connection parts on the side of the imaging element 10.

Such a configuration provides transmission of high-quality high-speed differential signals.

However, even in a case where the connector connection parts on the side of the signal processing part 30 are not configured similar to the connector connection parts on the side of the imaging element 10 and where only the connector connection parts on the side of the imaging element 10 are configured as depicted in FIG. 6, it is still possible to suppress a decrease in the quality of transmitted high-speed differential signals. Such a configuration is also one of the configurations according to the present disclosure.

Figure 7A:
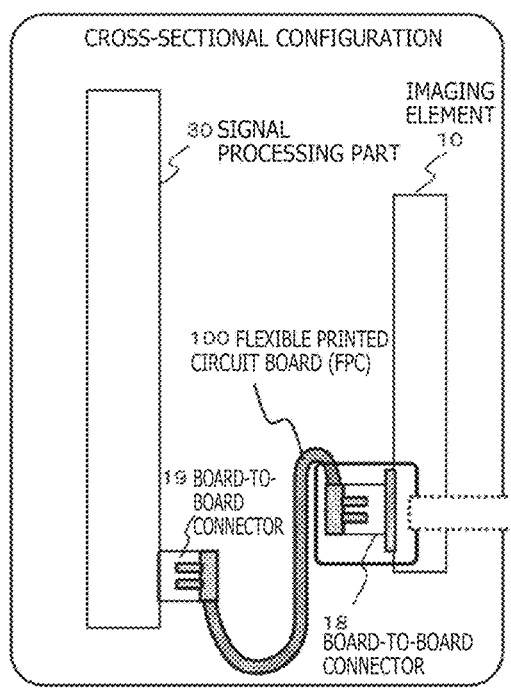
FIGS. 7A and 7B depict explanatory diagrams explaining a detailed configuration example of the flexible printed circuit board (FPC) and a board-to-board connector according to the present disclosure.
Figure 7B:
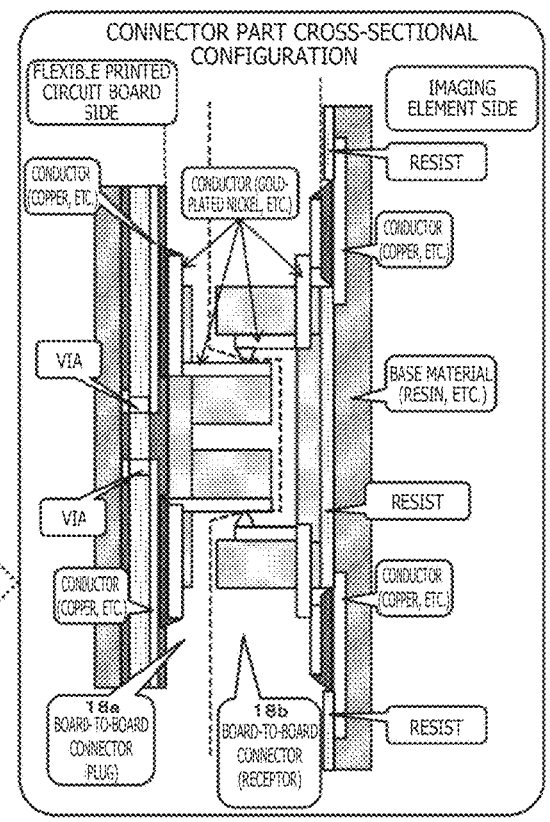

FIGS. 7A and 7B depict a detailed configuration example of the board-to-board connector according to the present disclosure.

A cross-sectional configuration depicted in FIG. 7A is similar to the one illustrated in FIG. 2A. It is to be noted, however, that "board-to-board connectors 18 and 19" are used as the connection parts between the flexible printed circuit board (FPC) 100 and the imaging element 10 and between the flexible printed circuit board (FPC) 100 and the signal processing part 30.

A connector part cross-sectional configuration in FIG. 7B is an enlarged cross-sectional view of the board-to-board connector 18 depicted in FIG. 7/A.

In FIG. 7B, the flexible printed circuit board side is on the left and the imaging element side is on the right.

A board-to-board connector (plug) 18a is configured on the flexible printed circuit board side and a board-to-board connector (receptor) 18b is configured on the imaging element side. Engaging the plug with the receptor provides connector connection and thereby connects the wiring of the flexible printed circuit board 20 with the wiring of the imaging element 10.

The connection is implemented by means of conductors (gold-plated nickel, etc.) formed inside the connectors depicted in FIG. 7B and other conductors (copper, etc.)

In the illustrated example, the board-to-board connector (plug) 18a is configured on the flexible printed circuit board side and the board-to-board connector (receptor) 18b is configured on the imaging element side. Alternatively, the receptor may be configured on the flexible printed circuit board side and the plug may be configured on the imaging element side.

As described above with reference to FIG. 6, the VIAs (through-holes) are configured on the flexible printed circuit board 100 of the present disclosure. The connection parts (GND, positive connection part, and negative connection part) on the front side of the flexible printed circuit board 100 receive the output signals from the imaging element side through the connector, before transmitting the received signals to the signal processing part side through the VIAs in the VIA (through-hole) formation part 113 and by way of the signal lines formed on the back side of the flexible printed circuit board 100.

FIGS. 8A and 8B depict explanatory diagrams explaining a cross-sectional configuration of the connection parts between the flexible printed circuit board 100 of the present disclosure in FIG. 6 on one hand and the connector on the imaging element side on the other hand.

FIGS. 8A and 8B depict three different cross sections A to C of the flexible printed circuit board 100 of the present disclosure illustrated in FIG. 6.

FIG. 8A is a plan view explaining the positions of the cross sections A to C corresponding partially to the configuration of the "connection parts for the connector on the imaging element side" depicted on the left side of FIG. 6.

FIG. 8B depicts details of the cross sections A to C.

As depicted in FIG. 8A, the cross section A is at a position where a positive signal line connection part 121 is formed in the first connection part column 111 and a negative signal line connection part 122 is formed in the second connection part column 112 on the front side of the flexible printed circuit board 100.

The cross section B is at a position where a positive signal line 141 is wired on the back side of the flexible printed circuit board 100.

The positive signal line 141 of the cross section B is connected with the positive signal line connection part 121 in the first connection part column 111 of the cross section A by way of a VIA 130.

The cross section C is at a position where a negative signal line 142 is wired on the back side of the flexible printed circuit board 100.

The negative signal line 142 of the cross section c is connected with the negative signal line connection part 122 in the second connection part column 112 of the cross section A by way of the VIA 130.

FIG. 8B depicts detailed configurations of the cross sections A to C.

Described hereunder is the cross section A, i.e., the cross section at a position where the positive signal line connection part 121 is formed in the first connection part column 111 and the negative signal line connection part 122 is formed in the second connection part column 112 on the front side of the flexible printed circuit board 100.

The positive signal line connection parts 121 and the negative signal line connection parts 122 on the front side of the flexible printed circuit board 100 are connected with conductors inside the connector (plug) 18a, i.e., with intra-connector (plug) conductors 110 to be connected with the connector (receptor) 18b on the imaging element side. This configuration allows the positive signal line connection parts 121 and the negative signal line connection parts 122 to receive the output signals from the imaging element side through the connector (receptor) 18b on the imaging element side and through the connector (plug) 18a, before transmitting the received signals by way of the illustrated VIAs (through-holes) 130 and onto the signal lines formed on the back side of the flexible printed circuit board 100.

In such a manner, the positive signal line connection parts 121 on the front side of the flexible printed circuit board 100 depicted in cross section B are connected with the positive signal lines 141 formed on the back side of the flexible printed circuit board 100 by way of the illustrated VIAs (through-holes) 130. A positive differential signal is transmitted to the signal processing part side by way of the positive signal line 141.

On the other hand, the negative signal line connection parts 122 on the front side of the flexible printed circuit board 100 depicted in cross section C are connected with the negative signal lines 142 formed on the back side of the flexible printed circuit board 100 by way of the illustrated VIAs (through-holes) 130. A negative differential signal is transmitted to the signal processing part side by way of the negative signal line 142.

According to the present disclosure, as described above, there are few differences between the configuration of the transmission path of a positive signal line and the configuration of the transmission path of a negative signal line, the two signal lines being paired to transmit a pair of differential signals, and the configurations are approximately the same.

Thus, there are no significant deviations of the impedance characteristics of the paired signal lines for transmitting each pair of differential signals, which permits high-quality transmission of differential signals. For example, even in a case where high-speed differential signals at frequencies as high as 5 GHz are transmitted, the transmission can be accomplished without a reduction in differential signal quality.

The "connection parts for the connector on the imaging element side" depicted on the left side of FIG. 6 make up a connection part configuration that has two parallel column lines of the connection parts (pins) as described above with reference to FIG. 5, i.e., a connection part configuration corresponding to the "board-to-board connector configuration." This configuration does not include the NC connection parts that are not connected with the signal lines as depicted in FIG. 5, so that all connection parts involved are utilized. The configuration allows large quantities of differential signals to be transmitted using small-sized, lightweight connectors.

4. Other Embodiments

Other embodiments of the present disclosure are described below with reference to FIG. 9 and subsequent drawings.

As described above with reference to FIG. 6, each of the multiple embodiments to be described hereunder includes the "connection parts for the connector on the imaging element side" having the first connection part column 111 and the second connection part column 112 as column lines in parallel to each other, with the VIA (through-hole) formation part 113 interposed therebetween.

The embodiments described below are ones in which the signal line connection parts in the first connection part column 111 are used in a different manner from those in the second connection part column 112.

In the first embodiment described above with reference to FIG. 6, the first connection part column 111 is configured to have a GND signal line connection part and a positive signal line connection part formed alternately from the top down, and the second connection part column 112 is configured to have a GND signal line connection part and a negative signal line connection part formed alternately from the top down.

Figure 9:
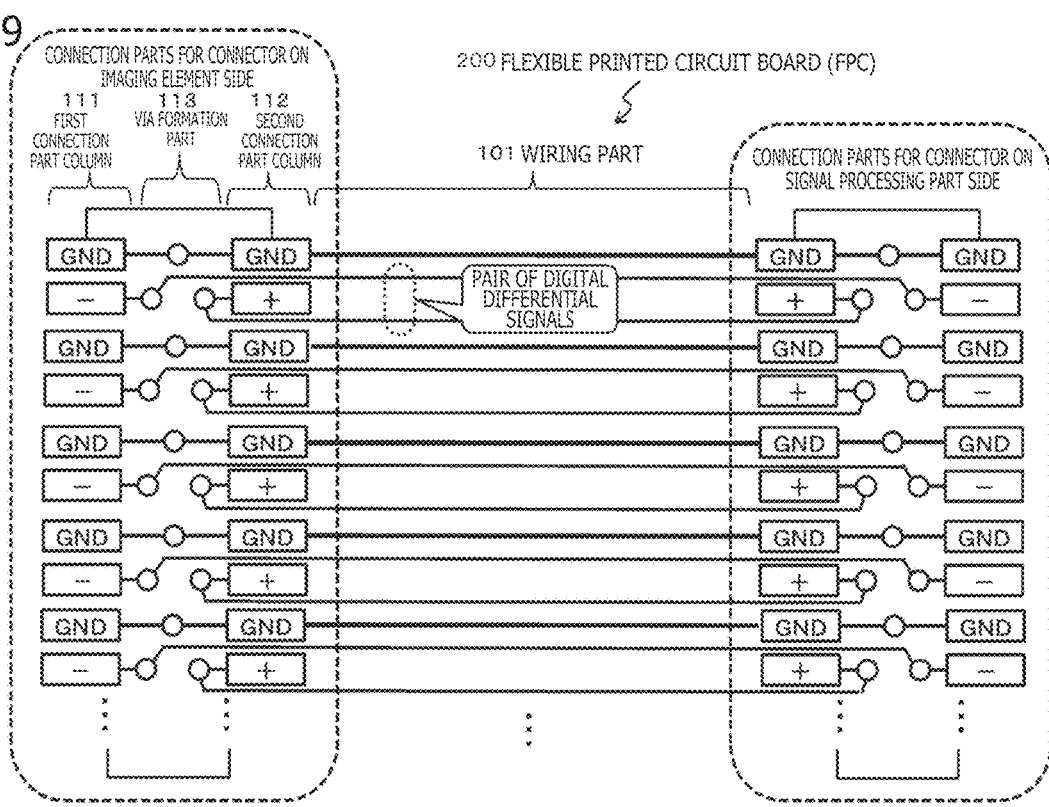

By contrast, on a flexible printed circuit board (FPC) 200 depicted as a second embodiment in FIG. 9, the first connection part column 111 is configured to have a GND signal line connection part and a negative signal line connection part formed alternately from the top down, and the second connection part column 112 is configured to have a GND signal line connection part and a positive signal line connection part formed alternately from the top down.

Rectangular regions indicated by symbols "GND," "+," and "−" in the first connection part column 111 and in the second connection part column 112 in FIG. 9 are the connection parts (contact points) connected with the output signal lines on the imaging element side. These connection parts are provided on the front side of the flexible printed circuit board 200.

The connection parts (GND, positive connection part, and negative connection part) on the front side of the flexible printed circuit board 200 receive the output signals from the imaging element side, before transmitting the received signals to the signal processing part side through the VIAs in the VIA (through-hole) formation part 113 and by way of the signal lines formed on the back side of the flexible printed circuit board 200.

That is, the signal lines of the wiring part 101 depicted in FIG. 9 constitute the wiring part configured on the back side of the flexible printed circuit board 200.

These configurations are similar to the one described above with reference to FIG. 6.

Preferably, the connector connection parts on the side of the signal processing part 30 may be configured similar to the connector connection parts on the side of the imaging element 10. This configuration provides transmission of high-quality high-speed differential signals.

However, even in a case where only the connector connection parts on the side of the imaging element 10 are configured as depicted in FIG. 6 and as described with reference thereto, it is still possible to suppress a decrease in the quality of transmitted high-speed differential signals. Such a configuration is also one of the configurations according to the present disclosure.

Figure 10:
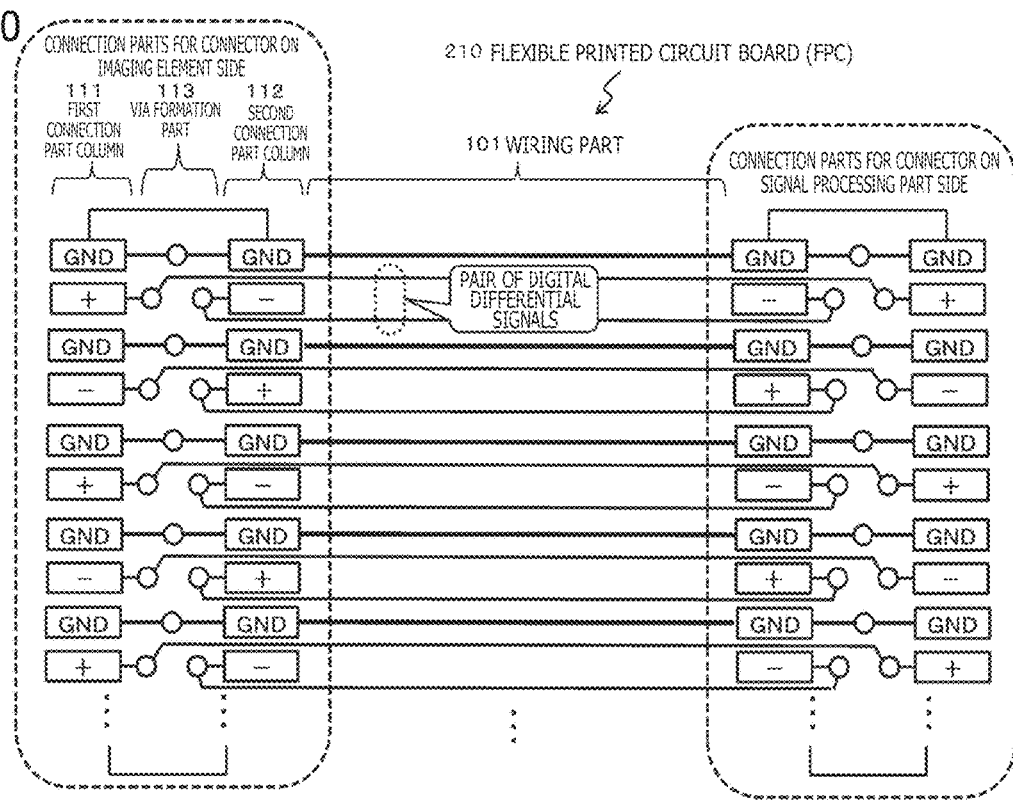

On a flexible printed circuit board (FPC) 210 depicted as a third embodiment in FIG. 10, the first connection part column 111 is configured to make up a repeating pattern of a GND signal line connection part, a positive signal line connection part, a GND signal line connection part, and a negative signal line connection part from the top down, and the second connection part column 112 is configured to make up a repeating pattern of a GND signal line connection part, a negative signal line connection part, a GND signal line connection part, and a positive signal line connection part from the top down.

In FIG. 10, rectangular regions indicated by symbols "GND," "+," and "−" in the first connection part column 111 and in the second connection part column 112 are also the connection parts (contact points) connected with the output signal lines on the imaging element side. These connection parts are provided on the front side of the flexible printed circuit board 210.

The connection parts (GND, positive connection part, and negative connection part) on the front side of the flexible printed circuit board 210 receive the output signals from the imaging element side, before transmitting the received signals to the signal processing part side through the VIAs in the VIA (through-hole) formation part 113 and by way of the signal lines formed on the back side of the flexible printed circuit board 210.

These configurations are similar to the one described above with reference to FIG. 6.

In the third embodiment, too, the connector connection parts on the side of the signal processing part 30 may preferably be configured similar to the connector connection parts on the side of the imaging element 10. Alternatively, only the connector connection parts may be configured as depicted in FIG. 6.

In each of the embodiments described above with reference to FIGS. 6, 9 and 10, the signal line (GND, +, −) connection parts formed at the connection parts for the connector on the imaging element side and the signal line (GND, +, −) connection parts at the connection parts for the connector on the signal processing part side are configured to be symmetrical with each other.

That is, in the configuration depicted in FIG. 6, for example, the positive signal line connection parts are formed at the outer side of the right and left ends of the flexible printed circuit board 100, and the negative signal line connection parts are formed at the inner side of the two ends of the flexible printed circuit board 100.

Figure 11:
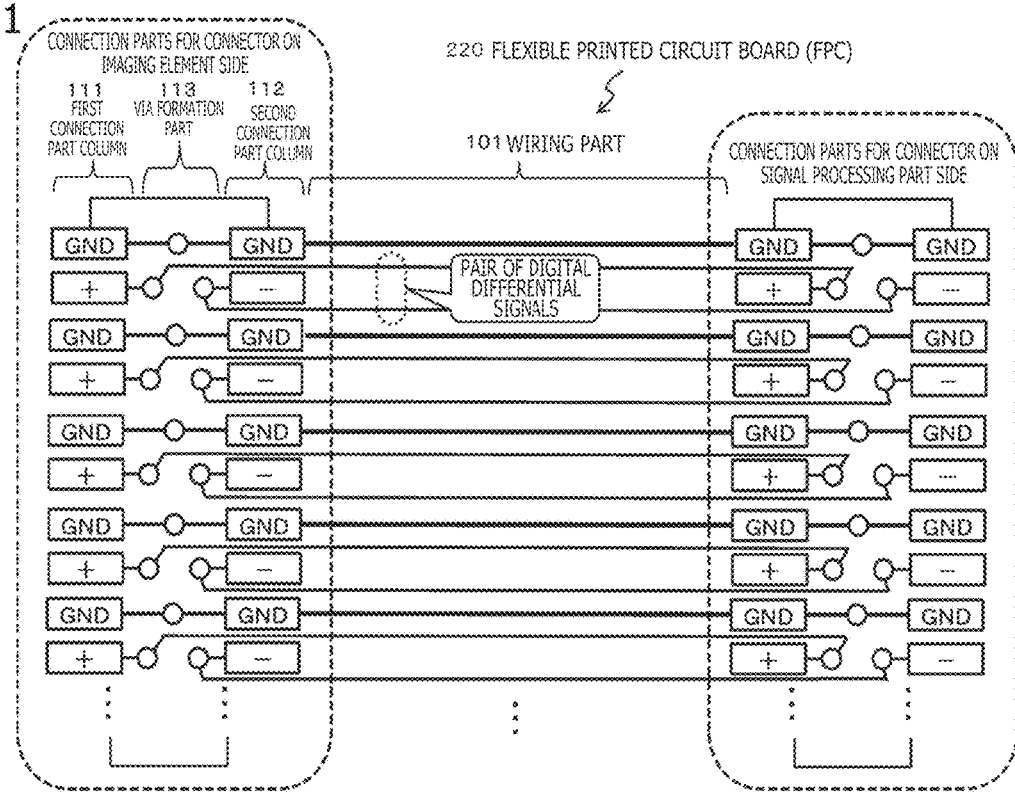

A flexible printed circuit board (FPC) 220 depicted as a fourth embodiment in FIG. 11 is configured such that the connection parts for the connectors at the right and left ends of the printed circuit board 220 are not symmetrical with each other.

As depicted in FIG. 11, the "connection parts for the connector on the imaging element side" on the flexible printed circuit board (FPC) 220 are configured as described above with reference to FIG. 6, the configuration being as follows.

The first connection part column 111 is configured to have a GND signal line connection part and a positive signal line connection part formed alternately from the top down, and the second connection part column 112 is configured to have a GND signal line connection part and a negative signal line connection part formed alternately from the top down.

On the other hand, the "connection parts for the connector on the signal processing part side" on the flexible printed circuit board (FPC) 220 are configured differently from the "connection parts for the connector on the signal processing part side" on the flexible printed circuit board (FPC) 100 depicted in FIG. 6 and described above with reference thereto.

The "connection parts for the connector on the signal processing part side" on the flexible printed circuit board (FPC) 220 depicted in FIG. 11 are configured such that those "connection parts for the connector on the signal processing part side" on the inner side (i.e., connection part column close to the imaging element) of the flexible printed circuit board (FPC) 100 in FIG. 6 are switched with those connection parts on the outer side (connection part column far from the imaging element) of the printed circuit board 100.

That is, in the configuration example depicted in FIG. 11, the GND signal line connection part and the negative signal line connection part are formed alternately on the outer side of the "connection parts for the connector on the signal processing part side" of the flexible printed circuit board (FPC) 220, and the GND signal line connection part and the positive signal line connection part are formed alternately on the inner side of the printed circuit board 220.

The above configuration makes it possible to equalize the lengths of all positive signal lines, negative signal lines, and GND signal lines on the flexible printed circuit board (FPC) 220, thereby further suppressing deviations of the impedance characteristics involved.

It is to be noted that the arrangements of the connection parts at the right and left ends of the flexible printed circuit board in FIG. 11 may also be applied to the embodiments illustrated in FIGS. 9 and 10 and described with reference thereto.

Figure 12:
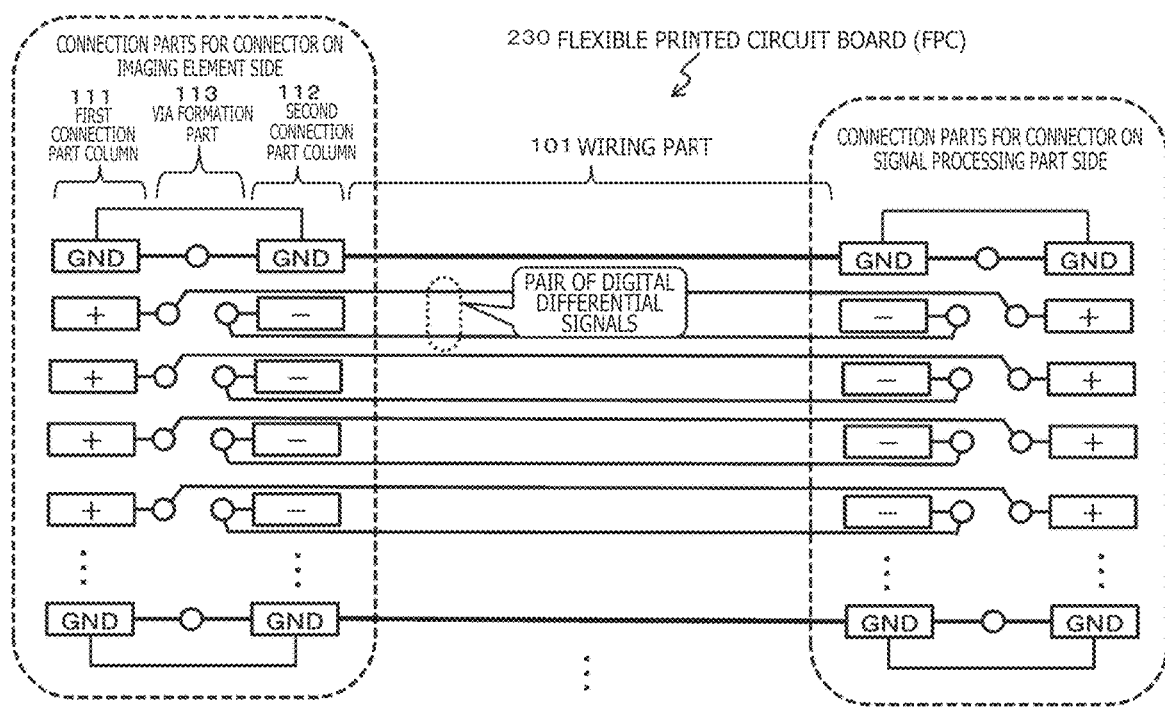

Described below with reference to FIG. 12 is a configuration example in which the GND signal lines are omitted.

In the embodiments described above with reference to FIGS. 6 and 9 to 11, each pair of positive and negative signal lines is provided with one GND signal line.

However, it is not mandatory to have each pair of positive and negative signal lines provided with one GND signal line. Alternatively, the GND signal lines may be omitted.

A configuration example in which the GND signal lines are omitted is described below.

A flexible printed circuit board (FPC) 230 depicted as a fifth embodiment in FIG. 12 is configured to have only two GND signal lines.

That is, every GND signal line located between the positive signal line and the negative signal line in the configuration of the first embodiment described above with reference to FIG. 6 is removed, with the exception of two GND signal lines at the top and bottom of the connection parts.

The above configuration reduces the number of the connection parts for the signal lines on the flexible printed circuit board (FPC) 230. As a result, the connector configuration is further reduced in size and weight.

Figure 13:
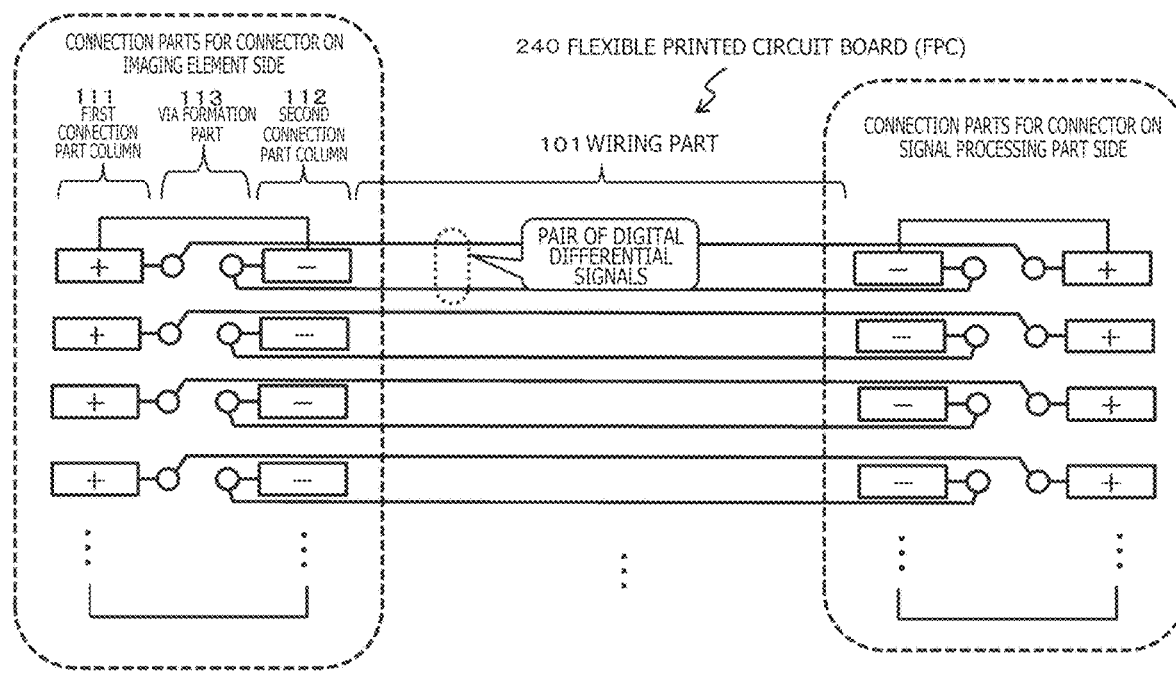

A flexible printed circuit board (FPC) 240 depicted as a sixth embodiment in FIG. 13 is configured to have no GND signal lines.

For example, if there is provided a configuration that has different GND signals made available separately on the imaging element side and on the signal processing part side, there is no need for the GND signal lines over which GND signals are to be exchanged between the imaging element side and the signal processing part side.

With all GND signal lines eliminated, the number of the connection parts for the connection lines on the flexible printed circuit board (FPC) 240 is reduced. As a result, the connector configuration is further reduced in size and weight.

5. Conclusion Regarding the Configurations According to the Present Disclosure The present disclosure has been explained in detail with reference to specific embodiments. These embodiments, however, may obviously be modified diversely or replaced with some other appropriate embodiments by those skilled in the art without departing from the spirit and scope of the disclosed technology. That is, this invention is disclosed using examples and should not be interpreted restrictively in accordance therewith. The scope of the present disclosure should be determined by the appended claims and their legal equivalents, rather than by the examples given.

The technology disclosed in the above description may be configured preferably as follows.

(1) A signal transmission apparatus including:
a flexible printed circuit board having signal transmission paths for transmitting a differential signal,
in which at least one of connector connection parts of the flexible printed circuit board has a first connection part column and a second connection part column obtained by arranging a plurality of signal line connection parts, the signal line connection parts being connection parts between the signal transmission paths and intra-connector wiring as two column lines in parallel with each other, and
each of the signal line connection parts formed in the first connection part column and in the second connection part column is configured to be connected with the signal transmission path formed on a back side of the flexible printed circuit board by way of a VIA (through-hole) formed between the first connection part column and the second connection part column.

(2) The signal transmission apparatus as stated in paragraph (1) above,
in which the first connection part column includes a GND signal line connection part and a positive signal line connection part corresponding to the differential signal, and
the second connection part column includes a GND signal line connection part and a negative signal line connection part corresponding to the differential signal.

(3) The signal transmission apparatus as stated in paragraph (2) above,
in which the first connection part column is configured to have the GND signal line connection part and the positive signal line connection part corresponding to the differential signal arranged alternately, and
the second connection part column is configured to have the GND signal line connection part and the negative signal line connection part corresponding to the differential signal arranged alternately.

(4) The signal transmission apparatus as stated in paragraph (1) above,
in which the first connection part column includes a GND signal line connection part, a positive signal line connection part corresponding to the differential signal, and a negative signal line connection part corresponding to the differential signal, and
the second connection part column includes a GND signal line connection part, a negative signal line connection part corresponding to the differential signal, and a positive signal line connection part corresponding to the differential signal.

(5) The signal transmission apparatus as stated in paragraph (4) above,
in which the first connection part column is configured to have the GND signal line connection part, the positive signal line connection part corresponding to the differential signal, and the negative signal line connection part corresponding to the differential signal arranged repeatedly, and
the second connection part column is configured to have the GND signal line connection part, the negative signal line connection part corresponding to the differential signal, and the positive signal line connection part corresponding to the differential signal arranged repeatedly.

(6) The signal transmission apparatus as stated in paragraph (1) above,
in which the first connection part column includes a GND signal line connection part at a top of the first connection part column and a GND signal line connection part at a bottom of the first connection part column, and a plurality of positive signal line connection parts corresponding to the differential signals and being set between the two GND signal line connection parts, and
the second connection part column includes a GND signal line connection part at a top of the second connection part column and a GND signal line connection part at a bottom of the second connection part column, and a plurality of negative signal line connection parts corresponding to the differential signals and being set between the two GND signal line connection parts.

(7) The signal transmission apparatus as stated in paragraph (1) above,
in which the first connection part column includes a plurality of positive signal line connection parts corresponding to the differential signals, and
the second connection part column includes a plurality of negative signal line connection parts corresponding to the differential signals.

(8) The signal transmission apparatus as stated in any one of paragraphs (1) to (7) above,
in which each of the connector connection parts at both ends of the flexible printed circuit board has a first connection part column and a second connection part column obtained by arranging a plurality of signal line connection parts, the signal line connection parts being connection parts between the signal transmission paths and intra-connector wiring as two column lines in parallel with each other, and
each of the signal line connection parts formed in the first connection part column and in the second connection part column is configured to be connected with the signal transmission path formed on the back side of the flexible printed circuit board by way of a VIA (through-hole) formed between the first connection part column and the second connection part column.

(9) The signal transmission apparatus as stated in paragraph (8) above, in which the signal line connection parts of each of the two connector connection parts at both ends of the flexible printed circuit board are arranged to be symmetrical with respect to a center between the two connectors.

(10) The signal transmission apparatus as stated in paragraph (8) above, in which the signal line connection parts of each of the two connector connection parts at both ends of the flexible printed circuit board are arranged to be asymmetrical with respect to a center between the two connectors, and the signal transmission paths for respective signals are made equal in length.

(11) A signal transmission method for performing a process of transmitting a differential signal by use of a flexible printed circuit board,
in which at least one of connector connection parts of the flexible printed circuit board has a first connection part column and a second connection part column obtained by arranging a plurality of signal line connection parts, the signal line connection parts being connection parts between the signal transmission paths and intra-connector wiring as two column lines in parallel with each other,
the signal transmission method including:
transmitting an output from the intra-connector wiring to the signal line connection parts configured in the first connection part column and in the second connection part column; and
transmitting the differential signal over the signal transmission path formed on a back side of the flexible printed circuit board and by way of a VIA (through-hole) formed between the first connection part column and the second connection part column.

INDUSTRIAL APPLICABILITY

As described above, the configuration of one embodiment of the present disclosure provides a signal transmission apparatus and a signal transmission method for use therewith, the apparatus using a small-sized connector configuration and a flexible printed circuit board to prevent a decrease in the quality of a differential signal.

Specifically, for example, the flexible printed circuit board has signal transmission paths for transmitting the differential signal. At least one of connector connection parts of the flexible printed circuit board has a first connection part column and a second connection part column, each of the columns including a plurality of signal line connection parts for connection between the signal transmission paths and intra-connector wiring. Each of the signal line connection parts in the connection part columns is configured to be connected with the signal transmission path formed on the back side of the flexible printed circuit board by way of a VIA (through-hole) between the first connection part column and the second connection part column. For example, the first connection part column includes a GND signal line connection part and a positive signal line connection part, and the second connection part column includes a GND signal line connection part and a negative signal line connection part.

The above configuration thus provides a signal transmission apparatus and a signal transmission method for use therewith, the apparatus using a small-sized connector configuration and a flexible printed circuit board to prevent a decrease in the quality of a differential signal.

REFERENCE SIGNS LIST

10: Imaging element
11: Connector
18: Board-to-board connector
20: Flexible printed circuit board
30: Signal processing part
31: Connector
100: Flexible printed circuit board
101: Wiring part
110: Intra-connector (plug) conductor
111: First connection part column
112: Second connection part column
113: VIA formation part
121: Positive signal line connection part
122: Negative signal line connection part
130: VIA (through-hole)
141: Positive signal line
142: Negative signal line
200: Flexible printed circuit board
210: Flexible printed circuit board
220: Flexible printed circuit board
230: Flexible printed circuit board
240: Flexible printed circuit board

The invention claimed is:

1. A signal transmission apparatus comprising:
a flexible printed circuit board having signal transmission paths for transmitting a differential signal,
wherein at least one of connector connection parts of the flexible printed circuit board has a first connection part column and a second connection part column obtained by arranging a plurality of signal line connection parts, the signal line connection parts being connection parts between the signal transmission paths and intra-connector wiring as two column lines in parallel with each other, and
each of the signal line connection parts formed in the first connection part column and in the second connection part column is configured to be connected with the signal transmission path formed on a back side of the flexible printed circuit board by way of a VIA (through-hole) formed between the first connection part column and the second connection part column.

2. The signal transmission apparatus according to claim 1, wherein the first connection part column includes a GND signal line connection part and a positive signal line connection part corresponding to the differential signal, and
the second connection part column includes a GND signal line connection part and a negative signal line connection part corresponding to the differential signal.

3. The signal transmission apparatus according to claim 2, wherein the first connection part column is configured to have the GND signal line connection part and the positive signal line connection part corresponding to the differential signal arranged alternately, and
the second connection part column is configured to have the GND signal line connection part and the negative signal line connection part corresponding to the differential signal arranged alternately.

4. The signal transmission apparatus according to claim 1, wherein the first connection part column includes a GND signal line connection part, a positive signal line connection part corresponding to the differential signal, and a negative signal line connection part corresponding to the differential signal, and
the second connection part column includes a GND signal line connection part, a negative signal line connection part corresponding to the differential signal, and a positive signal line connection part corresponding to the differential signal.

5. The signal transmission apparatus according to claim 4, wherein the first connection part column is configured to have the GND signal line connection part, the positive signal line connection part corresponding to the differential signal, and the negative signal line connection part corresponding to the differential signal arranged repeatedly, and the second connection part column is configured to have the GND signal line connection part, the negative signal line connection part corresponding to the differential signal, and the positive signal line connection part corresponding to the differential signal arranged repeatedly.

6. The signal transmission apparatus according to claim 1, wherein the first connection part column includes a GND signal line connection part at a top of the first connection part column and a GND signal line connection part at a bottom of the first connection part column, and a plurality of positive signal line connection parts corresponding to the differential signals and being set between the two GND signal line connection parts, and the second connection part column includes a GND signal line connection part at a top of the second connection part column and a GND signal line connection part at a bottom of the second connection part column, and a plurality of negative signal line connection parts corresponding to the differential signals and being set between the two GND signal line connection parts.

7. The signal transmission apparatus according to claim 1, wherein the first connection part column includes a plurality of positive signal line connection parts corresponding to the differential signals, and the second connection part column includes a plurality of negative signal line connection parts corresponding to the differential signals.

8. The signal transmission apparatus according to claim 1, wherein each of the connector connection parts at both ends of the flexible printed circuit board has a first connection part column and a second connection part column obtained by arranging a plurality of signal line connection parts, the signal line connection parts being connection parts between the signal transmission paths and intra-connector wiring as two column lines in parallel with each other, and each of the signal line connection parts formed in the first connection part column and in the second connection part column is configured to be connected with the signal transmission path formed on the back side of the flexible printed circuit board by way of a VIA (through-hole) formed between the first connection part column and the second connection part column.

9. The signal transmission apparatus according to claim 8, wherein the signal line connection parts of each of the two connector connection parts at both ends of the flexible printed circuit board are arranged to be symmetrical with respect to a center between the two connectors.

10. The signal transmission apparatus according to claim 8, wherein the signal line connection parts of each of the two connector connection parts at both ends of the flexible printed circuit board are arranged to be asymmetrical with respect to a center between the two connectors, and the signal transmission paths for respective signals are made equal in length.

11. A signal transmission method for performing a process of transmitting a differential signal by use of a flexible printed circuit board, wherein at least one of connector connection parts of the flexible printed circuit board has a first connection part column and a second connection part column obtained by arranging a plurality of signal line connection parts, the signal line connection parts being connection parts between the signal transmission paths and intra-connector wiring as two column lines in parallel with each other, the signal transmission method comprising:

transmitting an output from the intra-connector wiring to the signal line connection parts configured in the first connection part column and in the second connection part column; and transmitting the differential signal over the signal transmission path formed on a back side of the flexible printed circuit board and by way of a VIA (through-hole) formed between the first connection part column and the second connection part column.

* * * * *